US009488891B2

(12) United States Patent
Breese (10) Patent No.: US 9,488,891 B2
(45) Date of Patent: Nov. 8, 2016

(54) THIN-SURFACE LIQUID CRYSTAL BASED VOLTAGE SENSOR

(71) Applicant: National University of Singapore, Singapore (SG)

(72) Inventor: Mark Brian Howell Breese, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 14/120,067

(22) Filed: Apr. 22, 2014

(65) Prior Publication Data

US 2014/0313470 A1 Oct. 23, 2014

Related U.S. Application Data

(60) Provisional application No. 61/814,481, filed on Apr. 22, 2013.

(51) Int. Cl.
| | | |
|---|---|---|
| G02F 1/13 | (2006.01) | |
| G02F 1/139 | (2006.01) | |
| G01R 29/08 | (2006.01) | |
| G01R 3/00 | (2006.01) | |

(52) U.S. Cl.
CPC ......... *G02F 1/1396* (2013.01); *G01R 29/0885* (2013.01); *G01R 3/00* (2013.01)

(58) Field of Classification Search
CPC .... G02F 1/1313; G01R 3/00; G01R 19/0046
USPC .......................................................... 349/199
See application file for complete search history.

(56) References Cited

U.S. PATENT DOCUMENTS

| | | | |
|---|---|---|---|
| 5,585,304 A | * | 12/1996 | Hayashi ............ H01L 21/76251 148/DIG. 12 |
| 6,849,853 B2 | | 2/2005 | Ikeda et al. |
| 6,891,194 B2 | | 5/2005 | Izumi |
| 7,030,386 B2 | | 4/2006 | Pang et al. |
| 2001/0008271 A1 | | 7/2001 | Ikeda et al. |
| 2006/0050205 A1 | * | 3/2006 | Yang ................. G02F 1/133514 349/98 |
| 2007/0159577 A1 | * | 7/2007 | Atsushi ............... G02B 5/3058 349/96 |

(Continued)

OTHER PUBLICATIONS

Iliescu et al., "Characterization of Masking Layers for Deep Wet Etching of Glass in an Improved HF/HCl Solution", Surface & Coatings Technology 198, 314-318 (2005).

(Continued)

*Primary Examiner* — Sang V Nguyen
(74) *Attorney, Agent, or Firm* — Baker, Donelson, Bearman, Caldwell & Berkowitz, PC (57) ABSTRACT

A method for fabricating a liquid crystal (LC) device and large area LC devices is provided. The method includes forming a LC layer and forming a coated silicon wafer on at least one surface of the LC layer. The coated silicon wafer includes a sacrificial layer for providing structural strength during fabrication of the LC device and a thin coating layer serving as an external light transmissive layer, and the coated silicon wafer is formed such that the thin coating layer is formed on the LC layer and the sacrificial layer is formed on the thin coating layer. The method also includes fabricating the LC device and selectively removing at least a portion of the sacrificial layer of the coated silicon wafer to expose at least a portion of the thin coating layer to serve as an external layer of the LC device.

17 Claims, 11 Drawing Sheets

(56) References Cited

U.S. PATENT DOCUMENTS

| | | | | |
|---|---|---|---|---|
| 2010/0033647 | A1* | 2/2010 | Okita | H04N 5/2253 349/57 |
| 2010/0034987 | A1* | 2/2010 | Fujii | B32B 27/18 428/1.1 |
| 2011/0007243 | A1* | 1/2011 | Tanaka | C09B 7/00 349/96 |
| 2011/0057278 | A1* | 3/2011 | Kim | G01T 1/246 257/432 |
| 2011/0069264 | A1* | 3/2011 | Huang | G03F 7/0007 349/122 |
| 2011/0109818 | A1* | 5/2011 | Uneda | G02F 1/133526 349/5 |
| 2012/0147298 | A1* | 6/2012 | Lai | G02F 1/133502 349/96 |
| 2012/0206664 | A1* | 8/2012 | Brown | G06F 3/044 349/12 |
| 2013/0016312 | A1* | 1/2013 | Kim | G02F 1/137 349/97 |

OTHER PUBLICATIONS

Iliescu et al., "On the Wet Etching of Pyrex Glass", Sensors and Actuators A 143, 154-161 (2008).
Lin et al., "Study on Voltage Contrast in SEM", Journal of Vacuum Science and Technology 16(6), 1856-1860 (1979).
Peterka et al., "Imaging Voltage in Neurons", Neuron 69(1), 9-21 (2011).
Djurisic et al., "Voltage Imaging from Dendrites of Mitral Cells: EPSP Attenuation and Spike Trigger Zones," The Journal of Neuroscience 24 (30), 6703-6714 (2004).
Geim et al., "The Rise of Graphene", Nature Materials 6,1-14 (2007).
Neto et al., "The Electronic Properties of Graphene", Reviews of Modern Physics vol. 81, 109-162 (2009).
Martin et al., "Observation of Electron-Hole Puddles in Graphene Using a Scanning Single Electron Transitor", Nature Physics 4 (42), 144-148 (2008).
"Sharp Develops Super-Thin 2.2 Inch LCD 0.68 mm Thick", Phys. Org/News, 1 page (2007).

* cited by examiner

THIN-SURFACE LIQUID CRYSTAL BASED VOLTAGE SENSOR

PRIORITY CLAIM

The present application claims priority to U.S. Provisional Patent Application No. 61/814,481, filed Apr. 22, 2013.

FIELD OF THE INVENTION

The present invention generally relates to liquid crystal devices, and more particularly relates to a method for fabricating a thin-surface liquid crystal based voltage sensor and apparati utilizing such thin-surface liquid crystal based sensors.

BACKGROUND

Liquid crystal (LC) based devices are used to alter polarization of light passing through or reflected from such devices. A change in polarization is induced within the device by applying a potential difference across a liquid crystal layer thereof. Conventional LC based devices have a liquid crystal layer typically a few micrometers thick, the thickness having the effect of altering the twist of the liquid crystal layer thereby changing the ability of the liquid crystal layer to rotate the polarization angle of light.

The change in polarization can be detected by passing a beam reflected from or transmitted through the LC based device through a polarizer filter, which only allows light of a certain polarization to pass through or be reflected. This principle has been widely used to make cheap, passive matrix text and graphic displays, and more recently to make large-area display screens using active matrix transistor thin film (TFT) technology.

Conventional LC based devices have one or both surfaces formed by an external layer formed of a light transmissive medium such as glass to allow light from outside the device to pass through the external layer to an adjoining liquid crystal layer. In addition to being light transmissive, the external layer is also typically non-resilient due to material used and/or thickness of the layer in order to provide structural strength for the LC based device during fabrication (such as the afore-mentioned large area display screens).

The thick external layers composed of, for example, glass may be thinned by mechanical or chemical means. However, chemical thinning requires use of a main chemical that is concentrated hydrofluoric acid solutions (e.g., up to 48% HCl). Such chemicals are hazardous and present challenges when incorporating their use in the device fabrication process. Furthermore, chemical thinning does not necessarily produce a smooth surface as the achievable smoothness depends on the composition of the glass layer.

Alternatively, a thinner glass plate can be provided as the external layer during assembly. However, glass sheets having a thickness less than one millimeter are fragile and easily broken, particularly if the sheets encompass a large surface areas. Conventional minimum glass thicknesses which for use over relatively small areas (e.g., 1×1 cm$^2$) is typically half a millimeter; for large areas typically one millimeter is required making use of such glass sheets for thinner layers impractical.

Thus, what is needed is a method for fabricating a thin-surface (i.e., thin external layer) liquid crystal based sensor device. Furthermore, other desirable features and characteristics will become apparent from the subsequent detailed description and the appended claims, taken in conjunction with the accompanying drawings and this background of the disclosure.

SUMMARY

According to the Detailed Description, a method for fabricating a liquid crystal device is provided. The method includes forming a liquid crystal layer and forming a coated silicon wafer on at least one surface of the liquid crystal layer. The coated silicon wafer includes a sacrificial layer for providing structural strength during fabrication of the liquid crystal device and a thin coating layer serving as an external light transmissive layer, and the coated silicon wafer is formed such that the thin coating layer is formed on the liquid crystal layer and the sacrificial layer is formed on the thin coating layer. The method also includes fabricating the liquid crystal device and selectively removing at least a portion of the sacrificial layer of the coated silicon wafer to expose at least a portion of the thin coating layer to serve as an external layer of the liquid crystal device.

In addition, a method for fabricating a large area liquid crystal device is provided. The method includes forming a large area liquid crystal layer and forming a coated silicon wafer on at least one surface of the large area liquid crystal layer. The coated silicon wafer includes a sacrificial layer for providing structural strength during fabrication of the large area liquid crystal device and a thin coating layer serving as an external light transmissive layer, and the coated silicon wafer is formed such that the thin coating layer is formed on the large area liquid crystal layer and the sacrificial layer is formed on the thin coating layer. The method further includes fabricating the large area liquid crystal device and selectively removing at least a portion of the sacrificial layer of the coated silicon wafer to expose at least a portion of the thin coating layer to serve as an external layer of the large area liquid crystal device.

Further, an apparatus is provided including a sensor and a processing device. The processing device is electrically coupled to the sensor for measuring electromagnetic properties of electromagnetic rays passing through the sensor in response to differing voltage potentials of a liquid crystal layer of the sensor. The sensor includes a liquid crystal based voltage sensor comprising the liquid crystal layer and a thin electromagnetic transmissive surface layer formed on at least one surface of the liquid crystal layer and having a thickness over a substantial surface area of the at least one surface of the liquid crystal and having a thickness less than 10 micrometers.

BRIEF DESCRIPTION OF THE DRAWINGS

The accompanying figures, where like reference numerals refer to identical or functionally similar elements throughout the separate views and which together with the detailed description below are incorporated in and form part of the specification, serve to illustrate various embodiments and to explain various principles and advantages in accordance with a present embodiment.

FIG. 2, comprising FIGS. 2A and 2B, depicts graphs of operation of a thin surface LC based device, wherein

FIG. 4, comprising FIGS. 4A and 4B, depicts fabrication of a thin-surface LC based device in accordance with the present embodiment, wherein

Skilled artisans will appreciate that elements in the figures are illustrated for simplicity and clarity and have not necessarily been depicted to scale. For example, the dimensions of some of the elements in the block diagrams or flowcharts may be exaggerated in respect to other elements to help to improve understanding of the present embodiments.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description. It is the intent of the present embodiment to present a novel method to fabricate a LC based device having a LC layer a small distance (ranging from tens/hundreds of micrometers to a few micrometers) away from the external surface. Since the LC layer of this device is close to the external surface, a small change in surface potential induced by many different types of samples, materials, devices or external agents such as ionizing radiation, plasmas or intense electromagnetic radiation will alter light transmitted through LC layer. This advantageously allows even very small voltage changes to be detected and imaged. Such robust LC based devices have applications in different operating modes in a wide variety of research and technology fields such as the exemplary embodiments described herein.

The key aspect of the present embodiment is a method of producing a LC based device structure in which one surface is thin and contains no conducting ITO regions which are contacted to the eternal device portions. The LC layer is typically only a few micrometers beneath the thin surface. This may be achieved in a variety of ways, depending on the required layer thickness and area. In accordance with the present embodiment, one thick glass plate is replaced by an oxide-coated silicon wafer on one side or both sides of the structure with the oxide surface facing inwards (a silicon nitride layer may also be used). A suitable silicon thinning and removal process, which does not attack silicon dioxide, leaves a large area of the buried silicon dioxide exposed. Thus, any sample or radiation, such as a thin film of material, exposure to ionizing radiation, plasmas or intense electromagnetic radiation may induce a potential large enough to change the transmission of light through the LC layer to be detected and imaged. In this manner, fabrication in accordance with the present embodiment provides an inexpensive method for manufacturing liquid crystal devices for imaging voltage contrast in a wide variety of research and technology fields.

Furthermore, fabrication in accordance with the present embodiment overcomes present limitations to producing thin LC-based devices such as large area displays. Typically, the thickness of displays is determined by the thickness of the transparent substrates, such as glass. For areas great than a few square centimeters it is necessary to use glass of about one millimeter thickness as thinner sheets are fragile and subject to breaking during manufacture. In accordance with the present embodiment, use of a sacrificial silicon wafer thinning process opens a route to producing much thinner LC-based devices where the thick silicon wafer required during device fabrication and assembly is removed as a final step, leaving a LC-based device which can be tens of micrometers thick, depending on whether one or two surfaces are treated in this manner.

Figure 1:
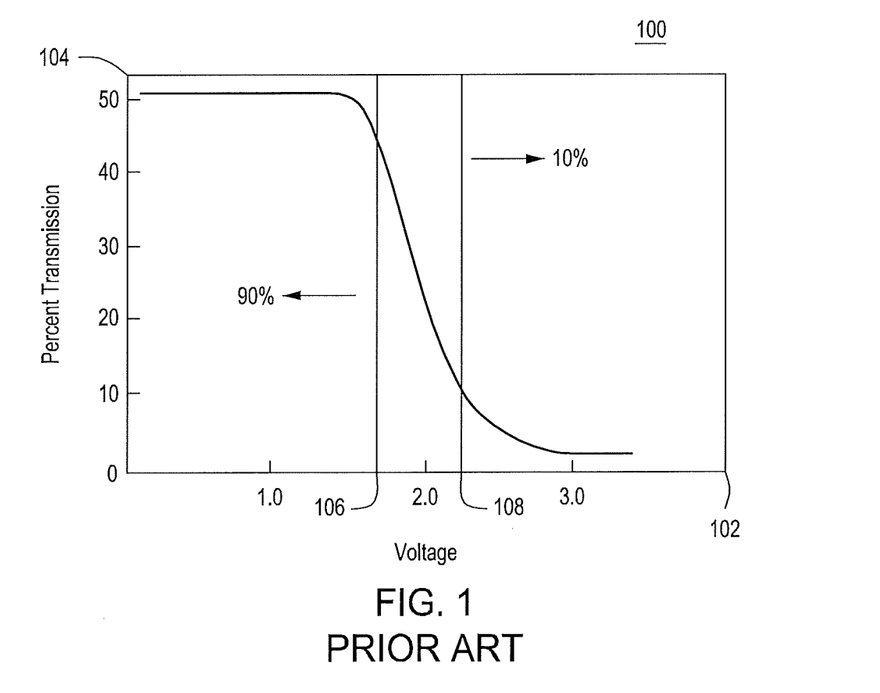
FIG. 1 depicts a graph of light transmission versus applied voltage of a conventional twisted nematic liquid crystal (LC) layer.

In a twisted nematic (TN) based LC display, transmission of light is determined by the ability of the LC layer to twist and untwist as a function of an applied voltage, i.e. the LC layer's electro-distortional response. A typical curve of transmission versus applied voltage is shown in a graph 100 of FIG. 1 where applied voltage is plotted along a x-axis 102 and percent light transmitted is plotted along a y-axis 104. Two vertical lines 106, 108 represent voltages at which a liquid crystal cell in the LC layer may be considered as being off 108 or on 106, i.e., the voltages at which the transmitted light is respectively 10% and 90% of its maximum value. In many types of applications, such as text or graphic displays, in order to address many pixels with a multiplexing scheme, a small difference between the off and on voltages is required which is difficult to achieve with a TN-based structure.

Figure 2A:
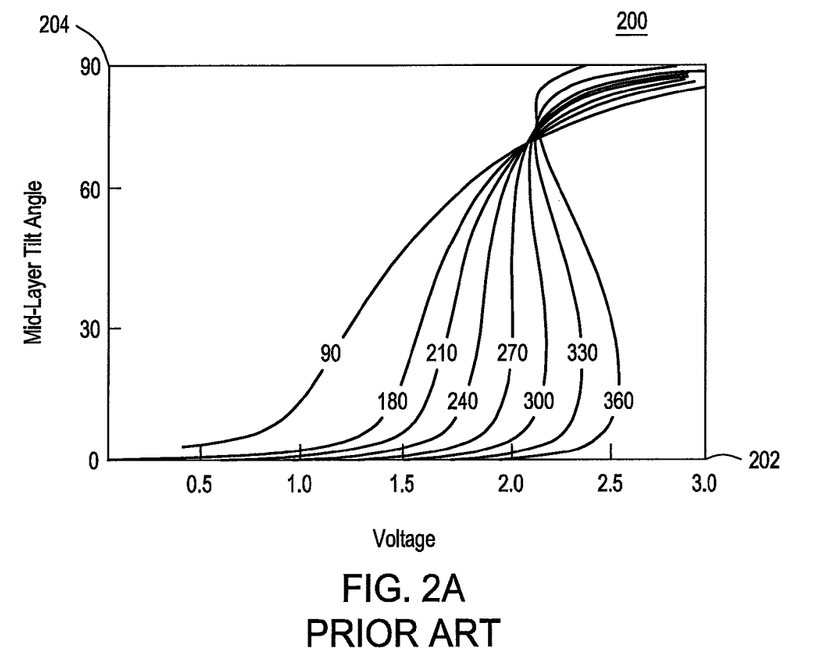
FIG. 2A is a graph of an electro-optical performance of the device and FIG. 2B is a graph of light transmission versus applied voltage of the super twisted nematic LC layer of the device.
Figure 2B:
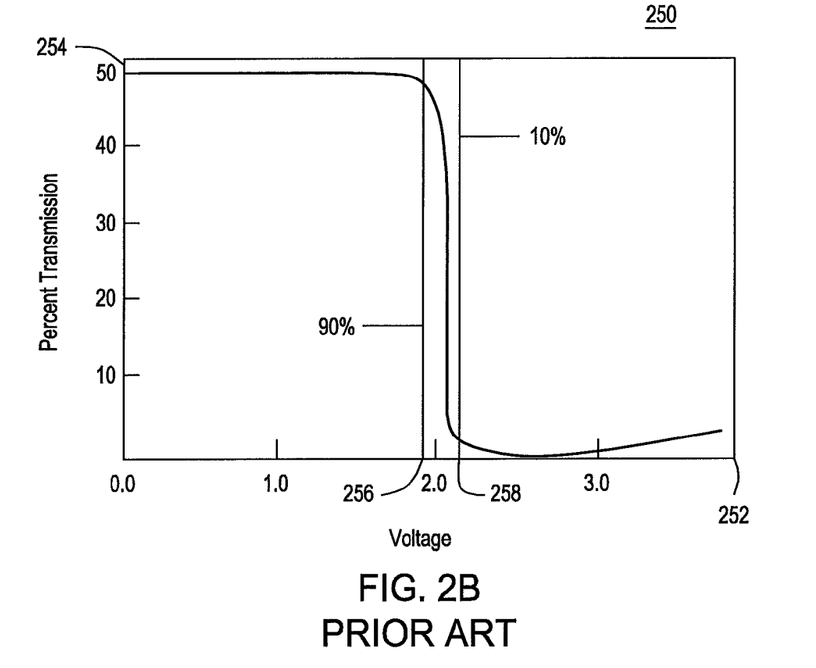

This problem is solved using super-twisted nematic (STN) LCs, where the effect of twist angle on the electro-optical response is shown in FIG. 2A. A graph 200 depicts tilt versus applied voltage for a typical STN LC where applied voltage is plotted along a x-axis 202 and angles of tilt are plotted along a y-axis 204. The change in the tilt angle becomes very abrupt as the twist angle is increased as seen from the eight tilt angles plotted in the graph 200. This leads to the off and on voltages being much closer than twisted nematic LCs that are not STN LCs, as shown in FIG. 2B. A graph 250 of FIG. 2B plots applied voltage along a x-axis 252 and percent light transmitted along a y-axis 254. Two vertical lines 256, 258 represent voltages at which a STN liquid crystal cell in the LC layer may be considered as being off 258 or on 256 Thus, for STN-based LC devices, only a small voltage increment of ~100 mV is needed to induce a large change in light transmission.

Figure 3:
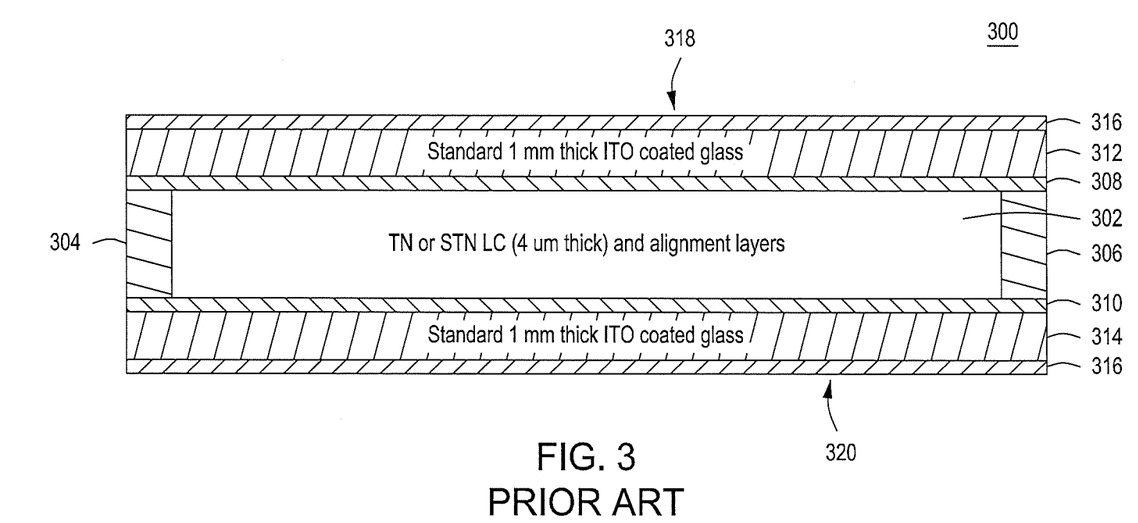
FIG. 3 depicts a side planar cross-sectional view of a conventional LC based device for altering the transmission of light utilizing a thin LC layer.

Referring to FIG. 3, a side planar cross-sectional view 300 of a conventional LC based device for altering the transmission of light utilizing a thin LC layer 302 sandwiched between alignment layers 304, 306, indium-tin-oxide (ITO) electrodes 308, 310 and thick (typically 1 mm) upper and lower glass plates 312, 314. Polarizers 316 may be formed on one or the other or both of the upper and lower glass plates 312, 314 for enablement of optical functionality of the LC based device.

The LC layer 302 is a few micrometers thick. A potential difference of a few volts is applied between the transparent, conducting ITO electrodes 308, 310 located very close the upper and lower surfaces 318, 320. So, assuming a LC layer thickness of 4 µm and a potential difference of, e.g., four volts to change state, this equates to an electric field strength of ~10 kV/cm. To induce a change in the state of the LC transmission using an external potential located adjacent the uppermost glass surface 318 would require a potential of about one thousand volts to achieve this same field strength, even without taking into account the dielectric nature of the glass.

Clearly this is too large for many applications of sensing a change in voltage of a substance of material at the glass surface, even though such a large voltage can be induced by intense ionizing radiation and plasmas. Apart from this consideration, a thick glass plate is needed to maintain adequate robustness during device assembly, so a minimum glass thickness of 0.5 mm is used for small area devices, about 1 cm square, and typically a glass plate thickness of 1 mm for larger area devices However, such structurally non-resilient constraints for the size and material of the external layers buries the LC layer under millimeters of the light transmissive material, such as burying the LC layer under requires light to pass through a millimeter(s)-thick glass plate. The distance light passes between the external surface and the LC layer (i.e., the thickness of the light transmissive layer) is directly related the surface potential the LC layer needed for the liquid crystal layer to rotate the polarization angle of light passing therethrough. Therefore, thicker external layers provide more structural stability but are less sensitive as a sensing device as more light is required to create a sensible surface potential in the LC layer.

In accordance with a present embodiment, an approach is provided to produce a thin-surface LC structure with one side down to only a few micrometers in thickness, preferably having a thickness less than ten micrometers. In addition larger thicknesses, up to tens/hundreds of microns, or thinner, down to about 1 micron can be achieved in accordance with the present embodiment and still provide the advantages and improvements of the present embodiment.

The present embodiment is based on selectively thinning down one side of a LC structure in a process which involves no very hazardous chemicals (though care with concentrated KOH solutions is still necessary). This processing in accordance with the present embodiment can produce extremely smooth silicon dioxide surfaces of only a few micrometers in thickness. Thus, the potential needed to affect the transmission of light through the LC is now advantageously only a few Volts or less, depending on the remaining glass thickness and the potential applied to the other, common ITO electrode. Depending on the required exposed device area, millimeter size areas of exposed glass areas can be achieved which are thinned down to 1 micron, or much larger areas (up to tens of square inches) can be achieved where the exposed glass surface is about 100 microns in thickness, depending on the required application and sensitivity.

Figure 4A:
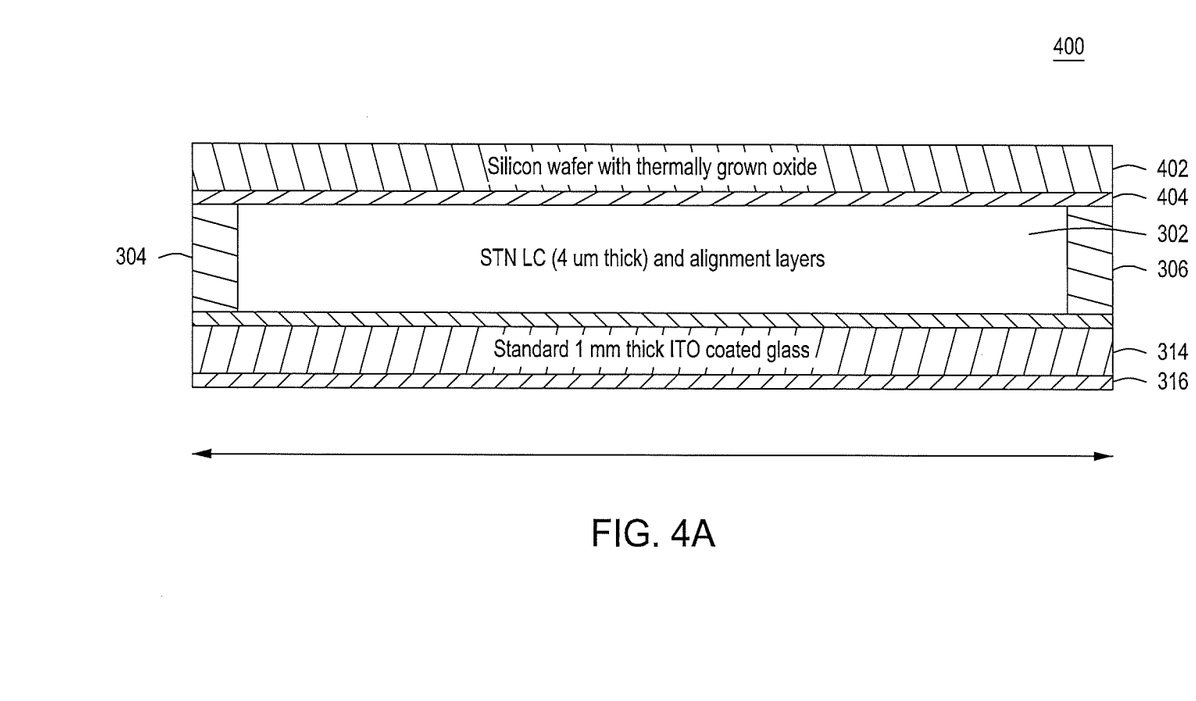
FIG. 4A depicts the device at a fabrication step wherein one of the surface layer glass plates is replaced by a silicon wafer with a thin silicon dioxide layer of several micrometers thickness at one surface and FIG. 4B depicts a later fabrication step of selective removal of a large area of the silicon wafer from the exposed upper surface leaving the thin silicon dioxide layer exposed.
Figure 4B:
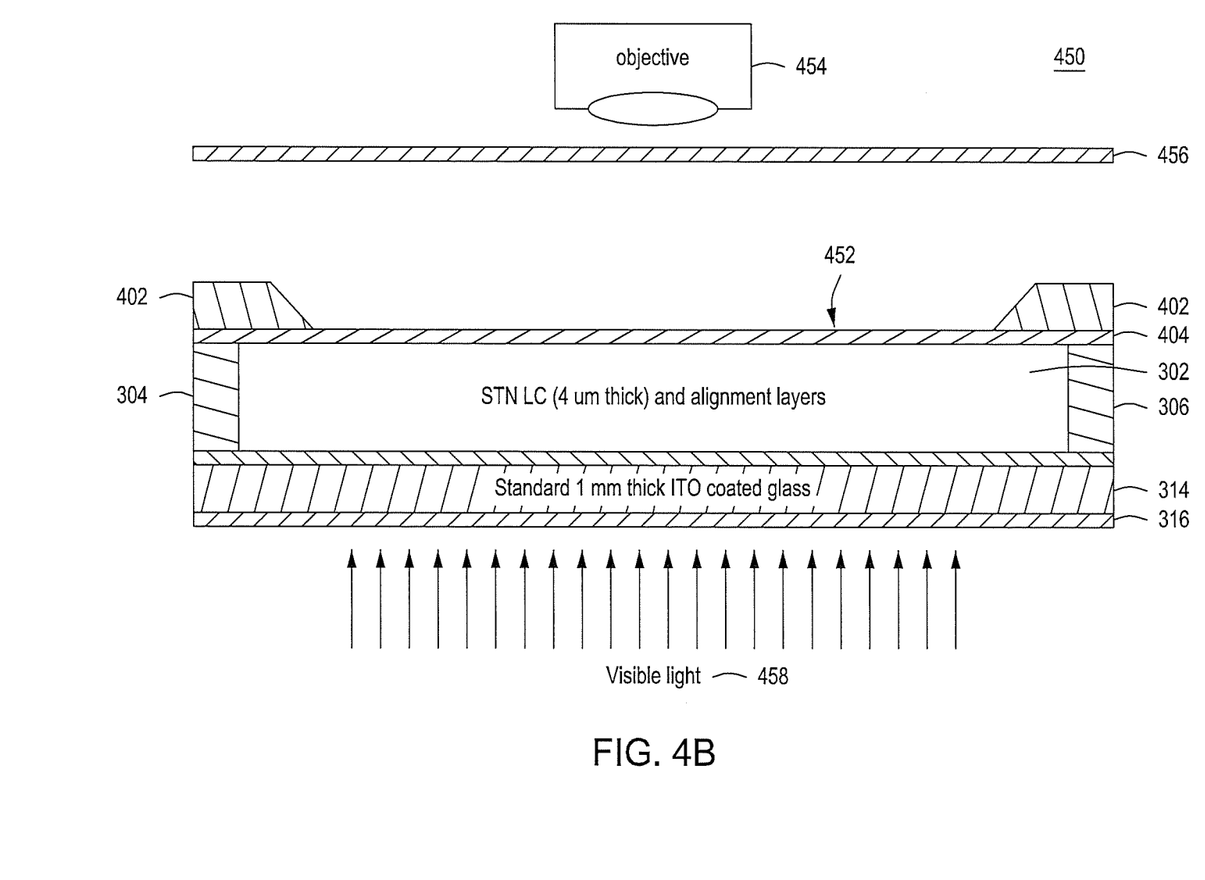

Referring to FIG. 4, comprising FIGS. 4A and 4B, fabrication of a thin-surface LC based device in accordance with the present embodiment is depicted. The method of fabrication includes steps of forming a liquid crystal layer, forming a coated silicon wafer on at least one surface of the liquid crystal layer, fabricating the liquid crystal device, and selectively removing at least a portion of the sacrificial layer of the coated silicon wafer to expose at least a portion of the thin coating layer to serve as an external layer of the liquid crystal device. FIG. 4A depicts a partially fabricated LC device 400 after the second step of fabrication in accordance with the present embodiment where one of the glass plates (the upper glass plate in this case) is replaced by a silicon wafer 402 which has a silicon dioxide layer 404 of several micrometers thickness at one surface. In this manner, the upper thick glass plate is substituted with the silicon wafer 402 which has a thick (typically several micrometers but can be much thicker) layer 404 of a thermally grown silicon dioxide on one surface (a silicon nitride layer can also be used with a modified process). The layer 404 of silicon dioxide is strong enough to confine the LC layer, is highly transparent and serves exactly the same purpose as the thick glass plate that it replaces.

FIG. 4B depicts a further fabricated LC device 450 after the fourth step of fabrication in accordance with the present embodiment where a large area of the silicon wafer 402 is selectively removed to expose an upper surface 452 of the silicon dioxide layer 404. The upper surface 452 may be exposed by a variety of processes, based on either wet or dry etching. In the simplest embodiment, the silicon is etched away from a selected area of the back surface by exposure to hot, concentrated solutions of potassium hydroxide (KOH). This chemical may be used perfectly safely subject to basic safety precautions. The etch rate of $SiO_2$ in KOH varies with both temperature and concentration of the solution, reaching about 300 nm/hour for 30% KOH at a temperature of 80° C. Hence, no high temperatures are involved during fabrication, with 80° C. being within the operating/storage range of LC devices, thereby not impairing subsequent operation or function of the LC devices fabricated in accordance with the present embodiment. The back surface area may be defined using a etch cell equipped with suitable O-rings, or the structure may be coated with a protective layer of a KOH resistant compound, such as silicon dioxide or silicon nitride or a suitable polymer.

The etch rate of silicon at this concentration and temperature of KOH solution is about 150 micrometers per hour, i.e. the selectivity in etch rate between Si and $SiO_2$ is several hundred times. Thus, even if the etch rate through the silicon is slightly variable across the exposed area, it does not matter as the slower etch rate of silicon dioxide means that the final oxide surface 452, once the remaining silicon is removed, is smooth and flat.

This process allows devices, thin films, charged structures, batteries, electrochemical cells, etc. to be placed directly on the exposed oxide surface and in very close proximity to the LC layer 302. Utilizing the present embodiment to fabricate a device which allows locating test devices more proximal to the LC layer 302, any significant change in the potential at the surface 452 may be large enough to locally change the light transmission properties of the LC layer 302. For example, locating an objective 454, such as a microscope or camera, and a polarizer layer 456 above the surface 452 and providing visible light 458 through the polarizer 316 on the back surface of the LC device in accordance with the present embodiment permits this change in the light transmission properties of the LC layer 302 to be viewed and/or recorded by the objective 454. Furthermore, in the presence of intense ionizing radiation, electromagnetic radiation and plasmas, a change can now be more easily induced in LC transmission as there is little attenuation through the thin glass dielectric 314. Depending on the required device area and application, the thickness of the glass layer 314 does not need to be as thin as a few microns, 100 microns would still result in much less attenuation of the surface potential in comparison to a 1 mm glass layer which strongly attenuates any signal.

There are modes of voltage contrast microscopy in a scanning electron microscope (SEM) or potentiometry using an atomic force microscope (AFM) which enable one to study changes in the surface potential of samples, such as microelectronic devices, chemical and electrochemical cells and devices and thin films, by measuring voltage-induced variations in secondary electron emission. This is a very successful mode of the SEM and AFM. Yet, in some applications of this mode in a SEM, one is (a) limited by beam-induced charging of the sample which masks any small potential variation present, (b) the application has to be used in vacuum, and (c) one can cause beam induced damage to biological samples and soft materials.

Figure 5:
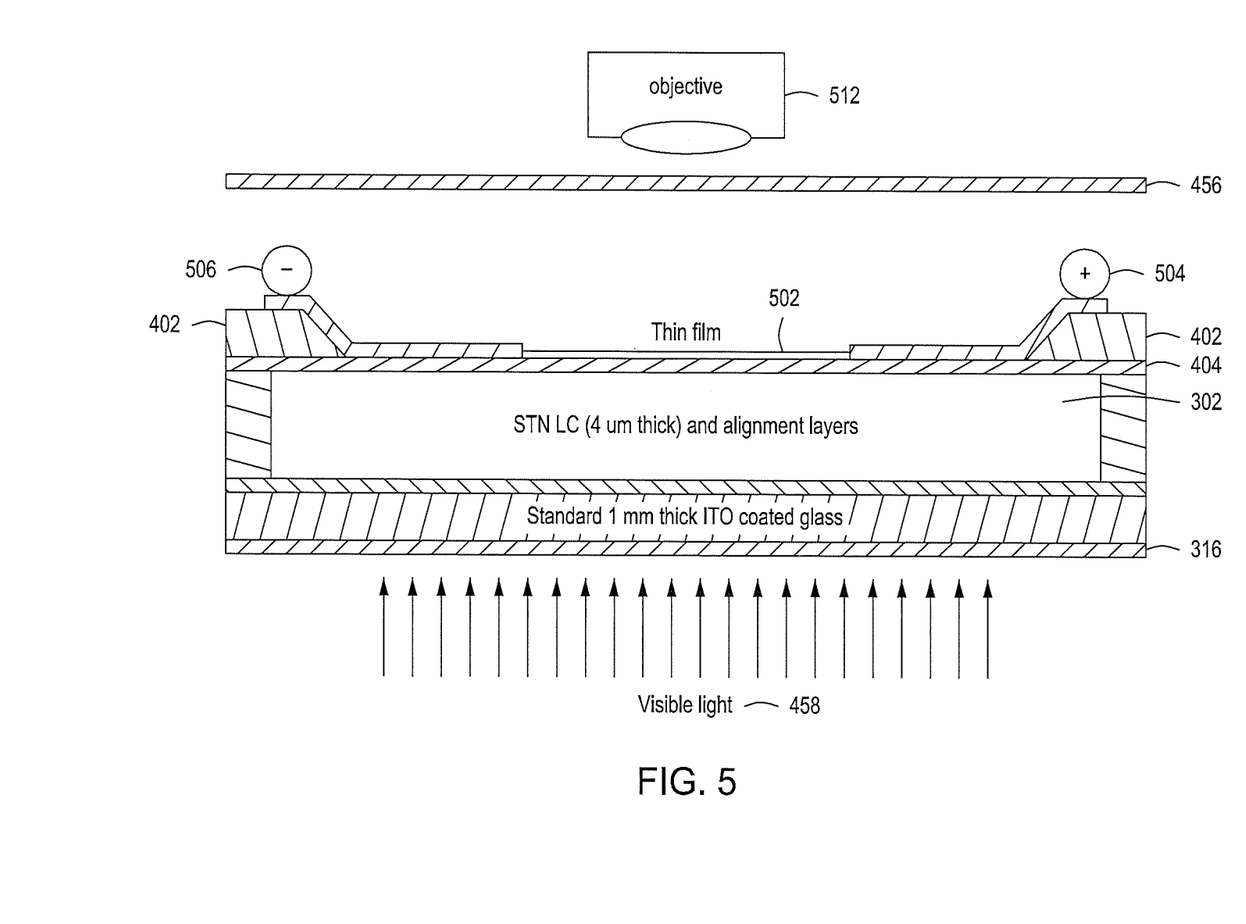
FIG. 5 depicts an apparatus for imaging potential variations in thin film materials which includes a thin-surface LC based voltage sensor device in accordance with the present embodiment.

Referring to FIG. 5, a side cross-sectional view 500 depicts an apparatus for imaging potential variations in thin film materials 502 which include a thin-surface LC based voltage sensor device in accordance with the present embodiment. To image potential variations in the thin film materials 502, a potential is applied across the thin film materials 502 by coupling the thin film materials 502 to electrodes 504, 506. The thin film materials 502 are thin enough to allow the transmitted light to be affected by any localized potential induced changes in the film 502. The potential bias is applied using the electrodes 504, 506 via connections 508, 510 on the thin oxide layer 404 and the surrounding thick silicon surface 402. The device incorporating the LC layer 302 will respond to the change in potential and can be imaged, either in reflection or transmission, without a need to be in a vacuum environment.

In addition, the thin-surface layer LC devices fabricated in accordance with the present embodiment are inexpensive, highly scalable, can be mass produced and require no other equipment other than a standard optical microscope 512, or even visible to the naked eye, depending on the nature of the structure and what is inducing a change in the optical transmission.

Figure 6:
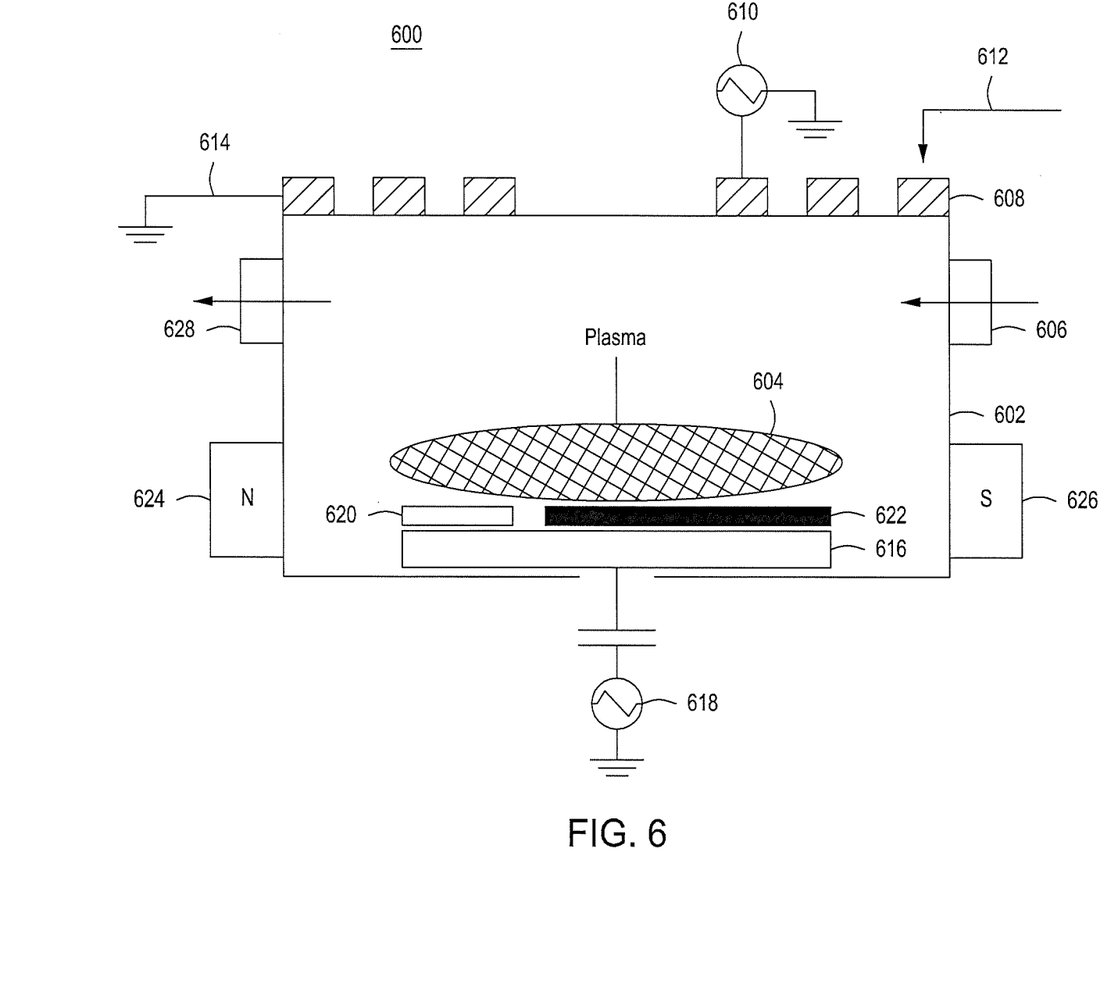
FIG. 6 depicts an apparatus for imaging a potential created by plasma in a plasma enhanced chemical vapor deposition (PECVD) chamber which includes a thin-surface LC voltage sensor based device in accordance with the present embodiment.

The applications of device structures fabricated in accordance with the present embodiment are not limited to placing material which can be charged on the thin surface 404. Thinning the front surface makes the LC layer 302 more easily changed by any form of external potential, such as strongly ionizing radiation, intense electromagnetic radiation or proximity of a plasma, since the effect of the glass dielectric in attenuating the field is greatly reduced. It follows that a devices capable of imaging the presence and changes in the magnitude and direction of external ionizing radiation, plasmas and electromagnetic radiation can also be achieved using devices fabricated in accordance with the present embodiment. Referring to FIG. 6, a diagram 600 depicts an apparatus 602 for imaging a potential created by plasma 604 in a plasma enhanced chemical vapor deposition (PECVD) chamber 606 which includes a thin-surface LC voltage sensor based device 608 fabricated in accordance with the present embodiment.

There are several modes of thin film deposition and growth that involve the use of plasmas to generate the species to be deposited. PECVD (plasma-enhanced chemical vapor deposition) deposits thin films from a gas state to a solid state on a substrate. Chemical reactions occur after creation of the plasma 604 of the reacting gases, the reacting gas being applied through an input valve 606. The plasma 604 is generally created by a radio frequency (RF) or DC discharge between two electrodes, with the space between them filled with the reacting gases. A set of first electrodes 608 are formed on the top of the chamber 602 and receive a first RF signal from a RF source 610 biased between power from a RF inductive coil 612 and ground 614. A second electrode 616 is coupled to biasing RF power source 618. PECVD is used in semiconductor manufacturing to deposit films onto wafers containing metal layers or other temperature-sensitive structures. PECVD provides some of the fastest deposition rates and high film quality (low roughness, few defects/voids), compared with other processes such as sputter deposition and thermal/electron-beam evaporation, often at the expense of uniformity.

In operation, a LC device 620 fabricated in accordance with the present embodiment and located on the electrode 616 along a substrate 622, provides a means of directly imaging the spatial distribution of the plasma 604, thereby giving a means of studying the causes of non-uniformity in the deposited layer thickness. The resultant charging induced by the plasma 604 which is maintained in proximity to the substrate 622 and the LC device 620 by a magnetic bucket formed by magnetic poles 624, 626 may be directly imaged using an in-vacuum camera (not shown), direct line-of-sight through a suitably placed window in the chamber (not shown), or the charge can be retained on a suitable surface layer for long enough to remove the LC device 620 from the chamber for external analysis (for example, after the reactant gas has been evacuated from the chamber 602 by a vacuum applied through a valve 628). In addition, the LC device 620 can be fabricated so inexpensively in accordance with the present embodiment in that damage to the LC device 620 during PECVD can be permanent for each substrate deposition.

Figure 7:
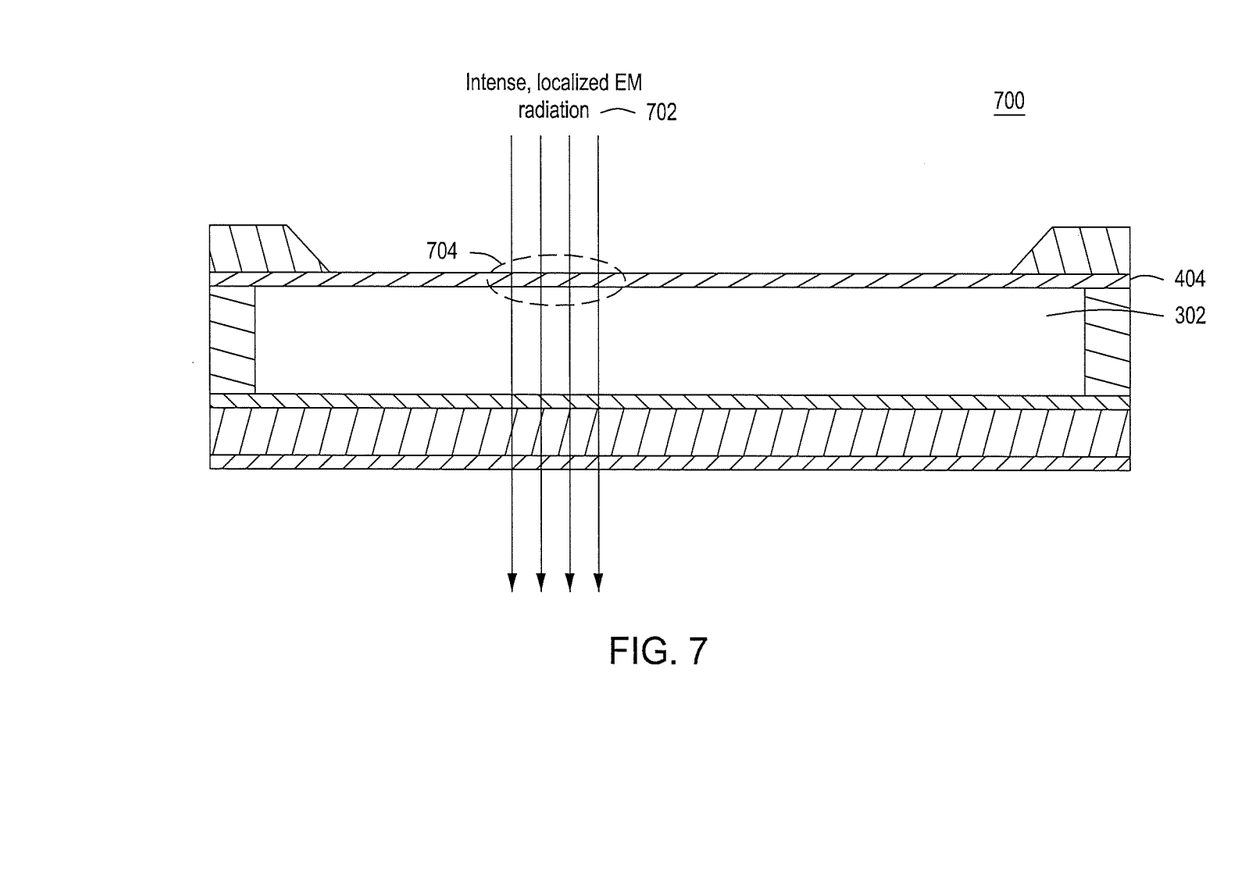
FIG. 7 depicts an apparatus for imaging presence and spatial distribution of intense electromagnetic radiation which includes a thin-surface LC based voltage sensor device in accordance with the present embodiment.

Referring to FIG. 7, a diagram 700 depicts an apparatus for imaging presence and spatial distribution of intense electromagnetic radiation 702 which includes a thin-surface LC based voltage sensor device in accordance with the present embodiment. In this apparatus, spatial distribution of the intense electromagnetic radiation 702 can be measured by localized charging (an increase in surface potential) 704 on the silicon dioxide layer 404 affecting the light transmissiveness of the LC layer 302.

Figure 8:
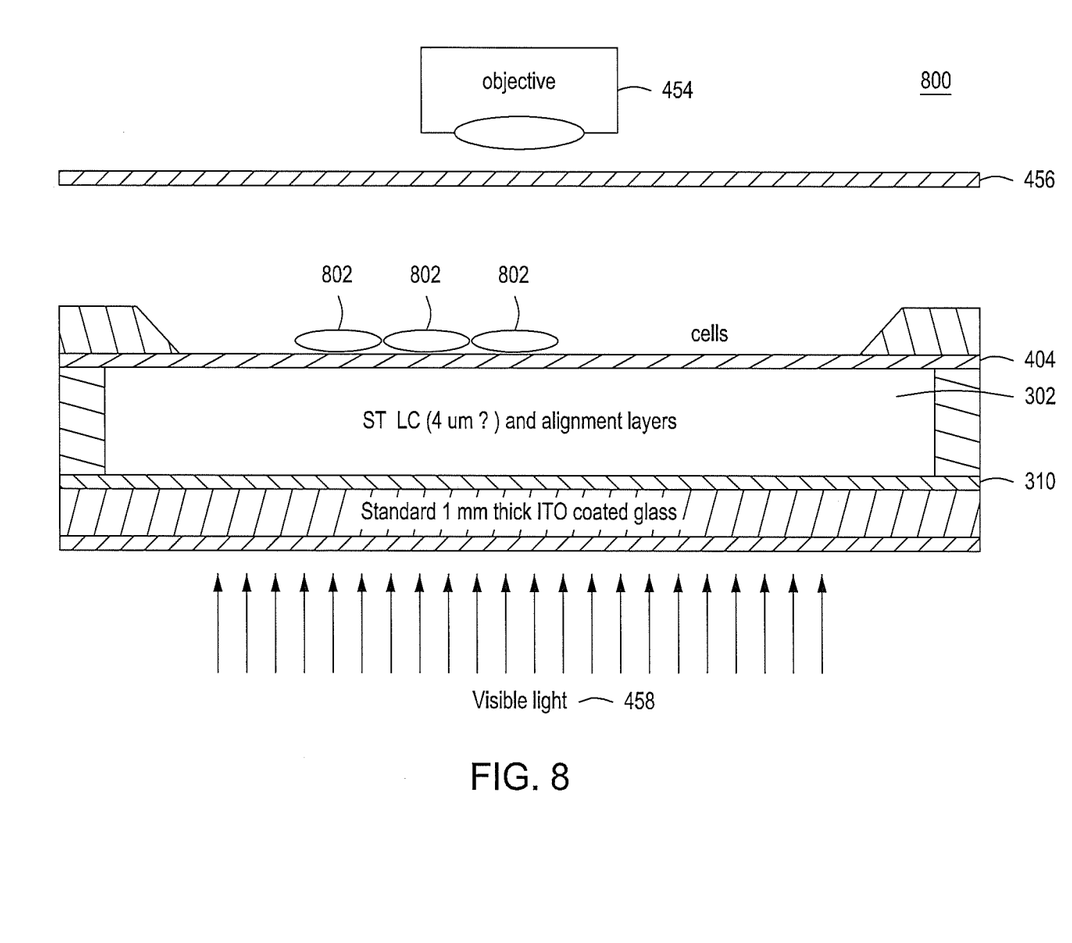
FIG. 8 depicts an apparatus for imaging cell potentials allowing normal optical microscopy in a reflection mode along with voltage contrast microscopy, the apparatus including a thin-surface LC based voltage sensor device in accordance with the present embodiment.

FIG. 8 depicts a diagram 800 of an apparatus for imaging cell 802 potentials allowing normal optical microscopy in a reflection mode along with voltage contrast microscopy. The apparatus includes a thin-surface LC based voltage sensor device fabricated in accordance with the present embodiment. While a surface of silicon dioxide is assumed for the layer 404, other transparent layers 404 may also be used if preferable to the biological system. The common, back surface electrode 310 may be raised or lowered in potential to enhance any small voltage differences across the sample.

Using voltage imaging microscopy, cell 802 potentials or neuron or membrane potentials may be measured using many different approaches, such as SHG chromophores, genetic indicators, hybrid, organic, fluorophores, and nanoparticles. Some relevant modes of optical spectroscopy typically require a high-power laser source which is expensive and may damage the sensitive biological tissues. Cell potentials of the order of 100 mV are similar to the potential difference which induces a large change in the optical transmission of the LC device depicted in FIG. 8. In accordance with the present embodiment, small potentials may be imaged by changing the potential of the back, common LC electrode 310.

Figure 9:
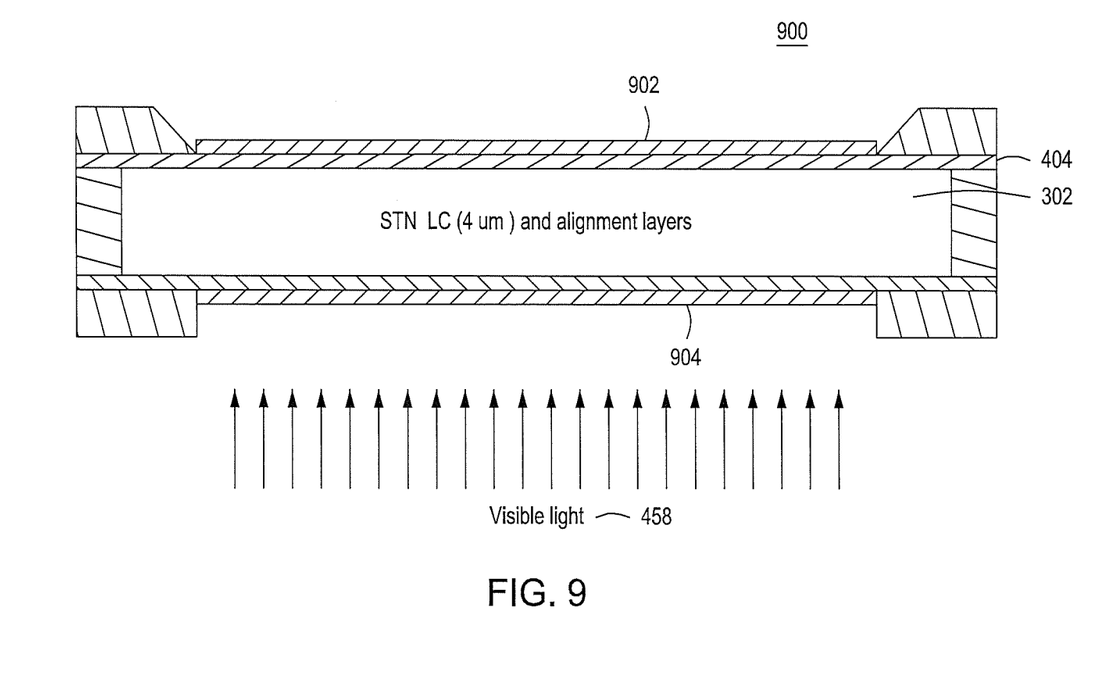
FIG. 9 depicts an ultra-thin liquid crystal display which includes thin-surface LC based device in accordance with the present embodiment.

Referring to FIG. 9 an ultra-thin liquid crystal display 900 which includes a thin-surface LC based device in accordance with the present embodiment. In the display 900, both surfaces 902, 904 are made into thin oxide layers, leaving an ultra-thin LC structure. In other embodiments, just a single surface may be thinned. The process described here for using a sacrificial silicon substrate as a means of producing a thin surface LC device may also be applied to the formation of large area LC display screens based on TFT technology. While thin displays (about 0.7 mm) may be produced using conventional technology, it is difficult to make thinner ones due to difficulties in handling large area thin glass films during fabrication. Fabrication in accordance with the present embodiment requires no thin large area substrates. Instead a thick, robust substrate of silicon is used, with back-thinning as a final step to expose the thin silicon dioxide surface.

Figure 10:
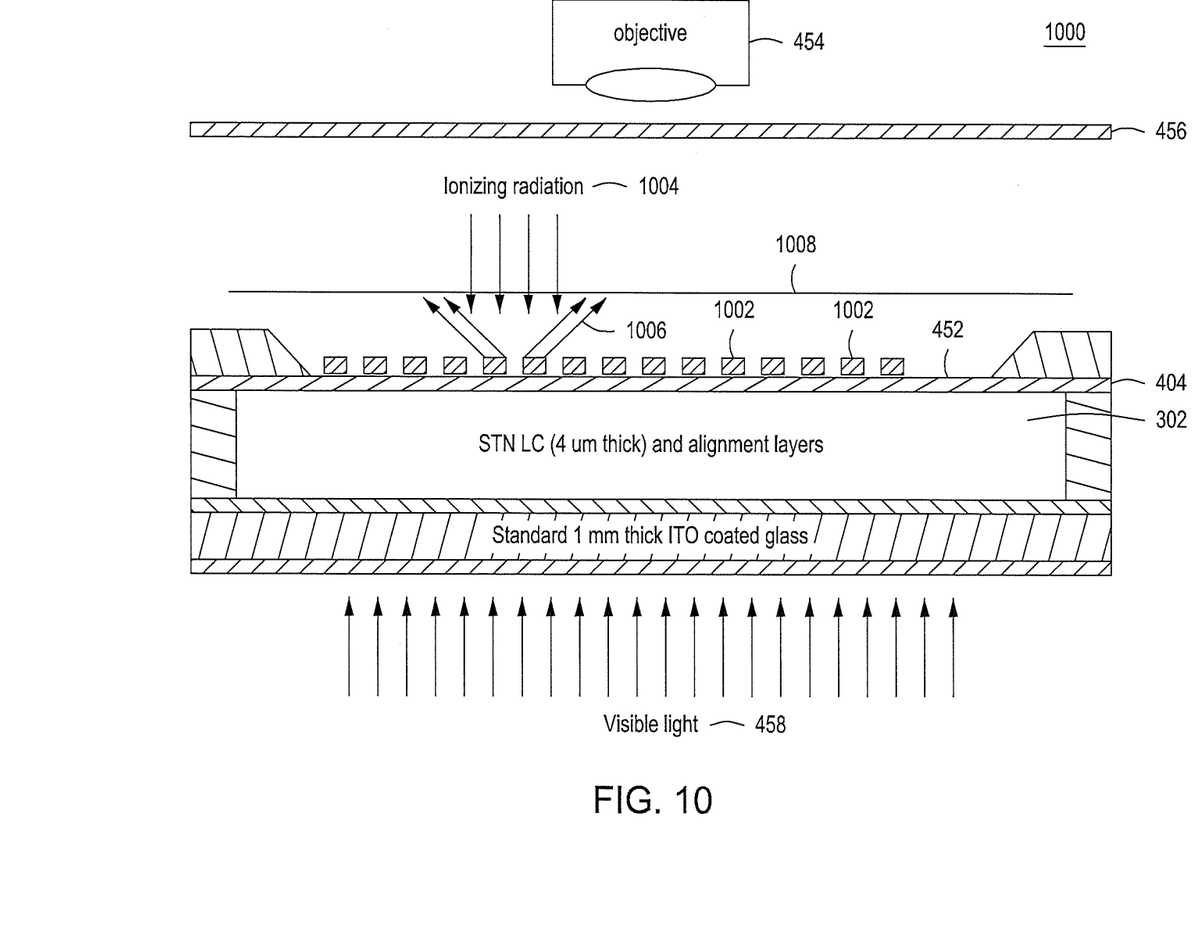
FIG. 10 depicts a radiation sensor which includes a thin-surface LC based device in accordance with the present embodiment.

FIG. 10 depicts a radiation sensor 1000 which includes a thin-surface LC based device in accordance with the present embodiment. As the radiation sensor 1000, the exposed thin glass surface 452 is patterned with small areas of a conducting material, such as metal 1002. Incident radiation 1004, such as ions or electrons, produces electron emission 1006 from the surface of the metal 1002, positively charging the irradiated surface portions of the oxide layer 404 and thereby increasing those locations to a potential level where the LC transmission is locally affected. A thin, large mesh or foil 1008 with high transparency may be placed in front of the device, with a positive applied bias, to facilitate the emission of secondary electrons and attract the electron emissions 1006 and these secondary electrons thereto, thereby assisting in the charging process of the oxide surface.

While the description herein focuses on a selective thinning process based on a silicon wafer with a silicon dioxide layer at one surface, there are other combinations which may be equally important and useful which can be implemented in accordance with the present embodiment. For example, it is also possible to use silicon nitride on silicon, silicon-on-sapphire, or silicon-on-diamond wafers which may provide a more robust or thinner surface layer, depending on the mode of use and application.

Also, while the description herein focuses largely on the step of producing a very thin surface layer using a selective thinning process of a silicon wafer with a silicon dioxide layer at the surface, the present embodiment can be implemented using a standard glass plate thickness of 1 mm. With the ITO removed from one surface, this device structure can be produced in large areas (in principle, many square feet), resulting in a large area, cheap form of detecting and imaging the presence of plasmas, intense electromagnetic fields and ionizing radiation in many different environments and from a wide range of devices.

Thus, in accordance with the present embodiment, an advantageous, robust method for fabricating a thin-surface liquid crystal based sensor device and apparatuses using such devices has been presented which overcomes the drawback of the prior art. In accordance with the present embodiment, means of producing a LC structure in which one surface is thin and contains no conducting ITO region which are contacted to the eternal device portions has been presented. The LC layer is typically only a few micrometers beneath the thin surface. Any sample, such as a thin film of material, exposure to ionizing radiation, plasmas or intense electromagnetic radiation may induce a potential large enough to change the transmission of light through the LC and so be detected and imaged. This provides an inexpensive method of imaging voltage contrast in a wide variety of research and technology fields. While exemplary embodiments have been presented in the foregoing detailed description of the invention, it should be appreciated that a vast number of variations exist. For example, those skilled in the art will realize from the teachings herein that the present technology may utilize any suitable silicon thinning and removal process, which does not attack silicon dioxide and leaves a large area of the buried silicon dioxide exposed.

It should further be appreciated that the exemplary embodiments are only examples, and are not intended to limit the scope, applicability, operation, or configuration of the invention in any way. Rather, the foregoing detailed description will provide those skilled in the art with a convenient road map for implementing an exemplary embodiment of the invention, it being understood that various changes may be made in the function and arrangement of elements and method of operation described in an exemplary embodiment without departing from the scope of the invention as set forth in the appended claims.

What is claimed is:

1. A method for fabricating a liquid crystal device, the method comprising:
   (a) forming a liquid crystal layer;
   (b) forming a coated silicon wafer in direct contact with at least one surface of the liquid crystal layer, the coated silicon wafer comprising a sacrificial layer and a thin coating layer;
      wherein the sacrificial layer provides structural strength during fabrication of the liquid crystal;
      wherein the thin coating layer serves as an external light transmissive layer; and
      wherein the coated silicon wafer is formed such that the thin coating layer is formed on the liquid crystal layer and the sacrificial layer is formed on the thin coating layer;
   (c) fabricating the liquid crystal device; and
   (d) selectively removing at least a portion of the sacrificial layer of the coated silicon wafer to substantially expose at least a portion of the thin coating layer to serve as an external layer of the liquid crystal device to allow light transmission altering samples to be placed in close proximity to the external layer for viewing through the liquid crystal layer.

2. The method for fabrication in accordance with claim 1 wherein the step of forming the liquid crystal layer comprises forming a super twisted nematic liquid crystal layer.

3. The method for fabrication in accordance with claim 1 wherein the step of forming the coated silicon wafer comprises forming the sacrificial layer comprising silicon.

4. The method for fabrication in accordance with claim 1 wherein the step of forming the coated silicon wafer comprises forming the thin coating layer comprising silicon dioxide.

5. The method for fabrication in accordance with claim 1 wherein the step of forming the coated silicon wafer comprises forming the thin coating layer comprising silicon nitride.

6. The method for fabrication in accordance with claim 1 wherein the step of selectively removing at least a portion of the sacrificial layer comprises selectively removing an area of the sacrificial layer of the coated silicon wafer to expose a portion of the thin coating layer to serve as an external layer of the liquid crystal device by immersing the liquid crystal device in potassium hydroxide.

7. The method for fabrication in accordance with claim 1 wherein the step of selectively removing at least a portion of the sacrificial layer comprises selectively removing an area of the sacrificial layer of the coated silicon wafer to expose a portion of the thin coating layer having a thickness less than ten micrometers to serve as an external layer of the liquid crystal device by immersing the liquid crystal device in potassium hydroxide.

8. The method for fabrication in accordance with claim 1 wherein the step of forming the coated silicon wafer in direct contact with at least one surface of the liquid crystal layer comprises forming the coated silicon wafer on only one surface of the liquid crystal layer.

9. The method for fabrication in accordance with claim 1 wherein the step of forming the coated silicon wafer in direct contact with at least one surface of the liquid crystal layer comprises forming the coated silicon wafer on both surfaces of the liquid crystal layer.

10. A method for fabricating a large area liquid crystal device, the method comprising:
(a) forming a large area liquid crystal layer;
(b) forming a coated silicon wafer in direct contact with at least one surface of the large area liquid crystal layer, the coated silicon wafer comprising a sacrificial layer and a thin coating layer;
wherein the sacrificial layer provides structural strength during fabrication of the large area liquid crystal device;
wherein the thin coating layer serves as an external light transmissive layer; and
wherein the coated silicon wafer is formed such that the thin coating layer is formed on the large area liquid crystal layer and the sacrificial layer is formed on the thin coating layer;
(c) fabricating the large area liquid crystal device; and
(d) selectively removing at least a portion of the sacrificial layer of the coated silicon wafer to substantially expose at least a portion of the thin coating layer to serve as an external layer of the liquid crystal device to allow light transmission altering samples to be placed in close proximity to the external layer for viewing through the liquid crystal layer.

11. The method in accordance with claim 10 wherein the step of forming the large area liquid device comprises forming a passive matrix text and/or graphic display.

12. The method in accordance with claim 10 wherein the step of forming the large area liquid crystal device comprises forming an active matrix display.

13. The method in accordance with claim 12 wherein the step of forming the active matrix display comprises forming an active matrix display using transistor thin film (TFT) technology.

14. The method of fabrication in accordance with claim 10 wherein the step of forming the coated silicon wafer in direct contact with at least one surface of the large area liquid crystal layer comprises forming the coated silicon wafer on only one surface of the large area liquid crystal layer.

15. The method for fabrication in accordance with claim 10 wherein the step of forming the coated silicon wafer in direct contact with at least one surface of the large area liquid crystal layer comprises forming the coated silicon wafer on both surfaces of the large area liquid crystal layer.

16. The method for fabrication in accordance with claim 1 wherein the step of selectively removing at least a portion of the sacrificial layer of the coated silicon wafer further comprises selectively removing at least the portion of the sacrificial layer of the coated silicon wafer to completely expose at least the portion of the thin coating layer to serve as the external layer of the liquid crystal device.

17. The method in accordance with claim 10 wherein the step of selectively removing at least a portion of the sacrificial layer of the coated silicon wafer further comprises selectively removing at least the portion of the sacrificial layer of the coated silicon wafer to completely expose at least the portion of the thin coating layer to serve as the external layer of the large area liquid crystal device.

* * * * *